United States Patent
Vogt

[19]

[11] Patent Number: 6,091,301
[45] Date of Patent: Jul. 18, 2000

[54] FLATNESS COMPENSATION OF DIPLEX FILTER ROLL-OFF USING ACTIVE AMPLIFIER PEAKING CIRCUIT

[75] Inventor: Stephan W. Vogt, Lawrenceville, Ga.

[73] Assignee: Scientific-Atlanta, Inc., Norcross, Ga.

[21] Appl. No.: 09/333,427

[22] Filed: Jun. 15, 1999

Related U.S. Application Data

[63] Continuation-in-part of application No. 09/135,548, Aug. 17, 1998, which is a continuation of application No. 08/657,168, Jun. 3, 1996, abandoned.

[51] Int. Cl.[7] .............................. H03G 3/10; H03F 3/04; H04H 1/00
[52] U.S. Cl. ..................... 330/278; 330/306; 330/310; 455/5.1
[58] Field of Search .................... 330/278, 302, 330/306, 310; 455/1, 5.1

[56] References Cited

U.S. PATENT DOCUMENTS

| | | |
|---|---|---|
| 3,581,122 | 5/1971 | Gaunt . |
| 3,582,804 | 6/1971 | Beck . |
| 4,054,910 | 10/1977 | Chou et al. . |
| 4,087,762 | 5/1978 | Ashley . |
| 4,090,150 | 5/1978 | Vachenauer . |
| 4,270,126 | 5/1981 | Bafaro . |
| 4,370,624 | 1/1983 | Ogawa et al. . |
| 4,575,650 | 3/1986 | Naimpally et al. . |
| 4,583,050 | 4/1986 | Shinomiya . |
| 4,703,285 | 10/1987 | Woo . |
| 4,812,779 | 3/1989 | Wagner . |
| 4,835,494 | 5/1989 | Preschutti . |
| 4,980,651 | 12/1990 | Koullias . |
| 5,191,407 | 3/1993 | Kawano et al. . |
| 5,307,026 | 4/1994 | Mucke . |
| 5,311,325 | 5/1994 | Edwards et al. ......................... 455/1 |
| 5,881,362 | 3/1999 | Eldering et al. ........................ 455/5.1 |

FOREIGN PATENT DOCUMENTS

| | | |
|---|---|---|
| 55-138139 | 10/1990 | Japan . |

Primary Examiner—Robert Pascal
Assistant Examiner—Patricia T. Nguyen
Attorney, Agent, or Firm—Kelly A. Gardner; Kenneth M. Massaroni; Hubert J. Barnhardt, III

[57] ABSTRACT

An amplifier (100) for amplifying signals includes a diplex filter (120) having a highpass filter (110) and a lowpass filter (115), and an amplifier circuit (205) for amplifying higher frequency signals provided by the highpass filter (110) of the diplex filter (120). Because the highpass filter (110) introduces attenuation of the higher frequency signals within a particular frequency range, the amplifier (100) also includes a gain control circuit (155) coupled to the amplifier circuit (205) for adjusting the gain of the particular frequency range. Both the diplex filter (120) and the gain control circuit (155) can reside in a plug-in module that can be inserted into and removed from the amplifier (100).

18 Claims, 3 Drawing Sheets

FLATNESS COMPENSATION OF DIPLEX FILTER ROLL-OFF USING ACTIVE AMPLIFIER PEAKING CIRCUIT

This is a continuation-in-part of application Ser. No. 09/135,548 filed Aug. 17, 1998 which is a continuation of application Ser. No. 08/657,168 filed Jun. 3, 1996 which has been abandoned.

FIELD OF THE INVENTION

The present invention generally relates to the field of radio frequency communication systems, and more particularly, is directed to a system for minimizing the effects of insertion loss when a diplex filter is used in an amplified transmission line.

BACKGROUND OF THE INVENTION

Diplex filters are well known in the prior art and are used to allow simultaneous passage of two electrical signals through the same transmission medium. U.S. Pat. No. 5,390,337 describes one example of a diplex filter and is incorporated herein by reference.

Diplex filters are typically used, for example, in radio frequency communications systems where the same antenna is used for both receiving and transmission. Diplex filters also have application in bi-directional repeater and land line systems such as two-way broadband communications systems and the like.

A diplex filter is usually a three-port passive device, as illustrated in FIG. 1. The diplex filter has an input terminal 1 for receiving an input signal in the "A" direction, an output terminal 2 for providing an output signal in the "B" direction and an input/output terminal 3 for bi-directional signals in the "A" and "B" directions. The diplexer includes a high-pass filter 4 and a low pass filter 5 which provide isolation between the bi-directional signals. High-pass filter 4 is connected between input terminal 1 and input/output terminal 3. Low-pass filter 5 is connected between output terminal 2 and input/output terminal 3.

When properly constructed, high-pass filter 4 passes energy within a first designed band pass between input terminal 1 and input/output terminal 3 with minimum attenuation while providing a high degree of attenuation for energy outside of the band pass. Low-pass filter 5, on the other hand, passes energy within a second designed band pass with minimum attenuation while providing a high degree of attenuation for energy outside of the second band pass. In summary, each filter circuit within the diplexer provides a high Q passband for one band of frequencies while rejecting energy at frequencies outside the band.

While diplex filters play an important role in providing efficient and cost effective communications, they also cause some attenuation of the signals within the pass band due to insertion loss. Thus, the design and use of a diplex filter often requires tradeoff between adequate isolation between the two bands of frequencies of interest and acceptable insertion loss.

A diplex filter has more insertion loss at the band edges than in the middle of the passband. This characteristic insertion loss causes a frequency response variation, or roll-off, that becomes significant when the filters are cascaded, e.g., in two-way broadband communications system. Roll-off is generally defined as a gradual increase in signal loss or attenuation with an increase or decrease in frequency of the signal beyond the substantially flat portion of the amplitude-frequency response characteristic of the system.

Such roll-off at the band edges is illustrated in FIG. 2. FIG. 2 is an amplitude-frequency response graph which compares the amplitude of the pass signal 5 through the filter with its frequency. Ideally, all signals within the pass band will pass through the filter with minimum attenuation and without amplitude variation due to frequency. As pointed out above, however, signal frequencies near the edges of the pass band will suffer greater attenuation as illustrated by the roll-off area shown in FIG. 2.

In the prior art, the effects of insertion loss are addressed with a trim or frequency compensation circuit. The compensation circuit compensates for the roll-off with the goal being a flat frequency response for the system. While the use of trim circuitry decreases the amount of roll-off, the trim circuit itself adds insertion loss to the system. Moreover, each pass band of frequencies, i.e., frequency split, requires a different trim circuit. The need for different trim circuits for each frequency split, usually results in a compromise to the different roll-off characteristics.

The general problem of signal attenuation in a cable distribution system, for example, is addressed in U.S. Pat. No. 4,087,762 which issued in the name of Albert H. Ashley.

The Ashley patent is specifically directed to a cable equalization resonant amplifier circuit which includes circuitry for compensating for the effects of signal attenuation in long coaxial cable runs. The patent teaches locating the amplifier circuit at the receiver end of the cable run and matching the gain of the amplifier with the attenuation characteristics of the cable over the bandwidth of signals being amplified by the amplifier. The Ashley patent does not, however, address the above described problem associated with the use of diplex filters, especially in a two-way broadcast distribution system.

Thus, there is a need in the art for an improved method and apparatus of reducing and/or eliminating the effects of insertion loss attributed to diplex filters.

DETAILED DESCRIPTION OF THE PREFERRED EMBODIMENT

The present invention has partial application in a two-way broadband communication system and signal amplifier system used therein. One example of such an amplifying system is described in a commonly assigned application entitled "Reconfigurable Node For Communications Network", Ser. No. 09/102,026, first filed on Jun. 3, 1996, and incorporated herein by reference.

Figure 1:
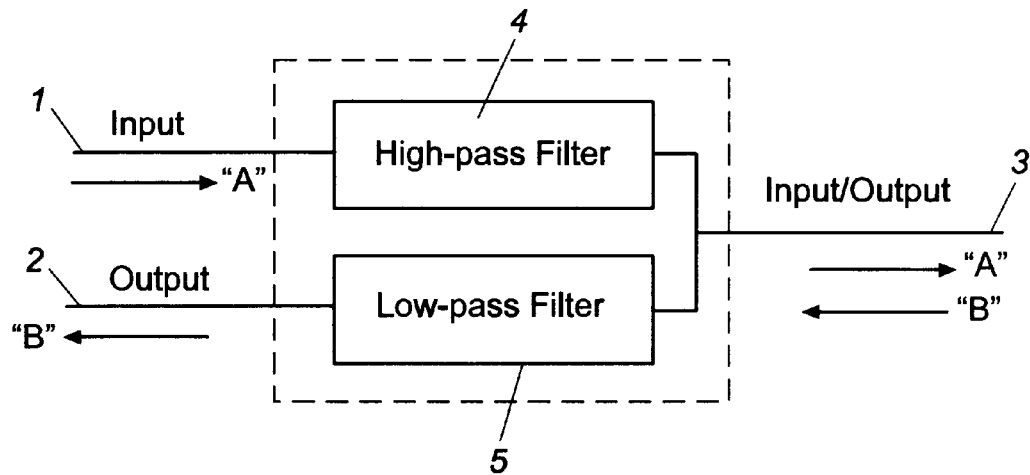
FIG. 1 is block diagram of a typical diplex filter circuit.
Figure 2:
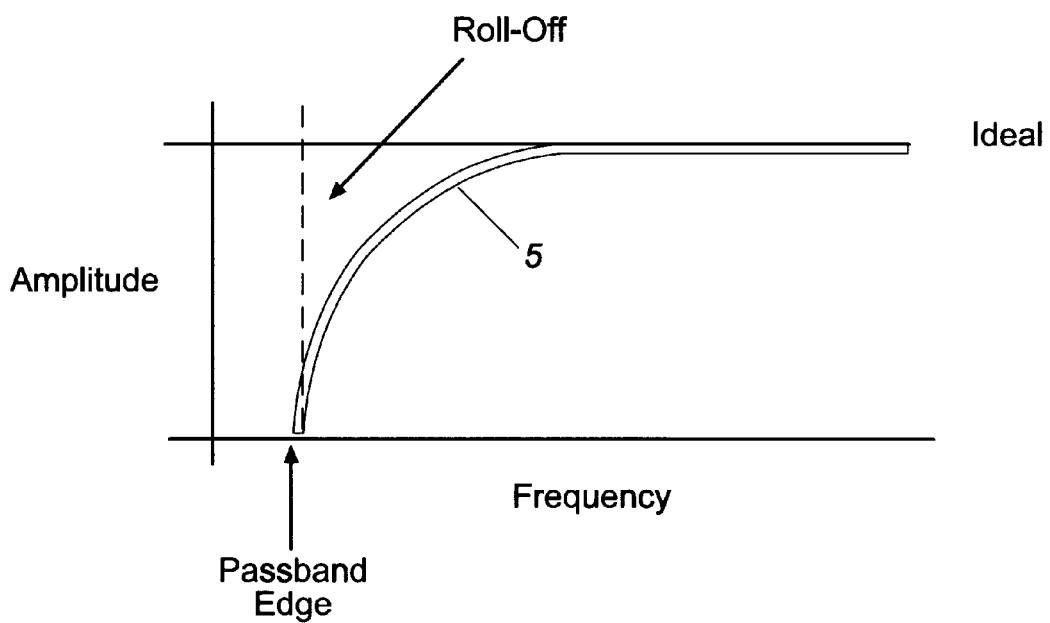
FIG. 2 is an amplitude-frequency graph illustrating the roll-off characters of a typical prior art diplex filter.
Figure 3:
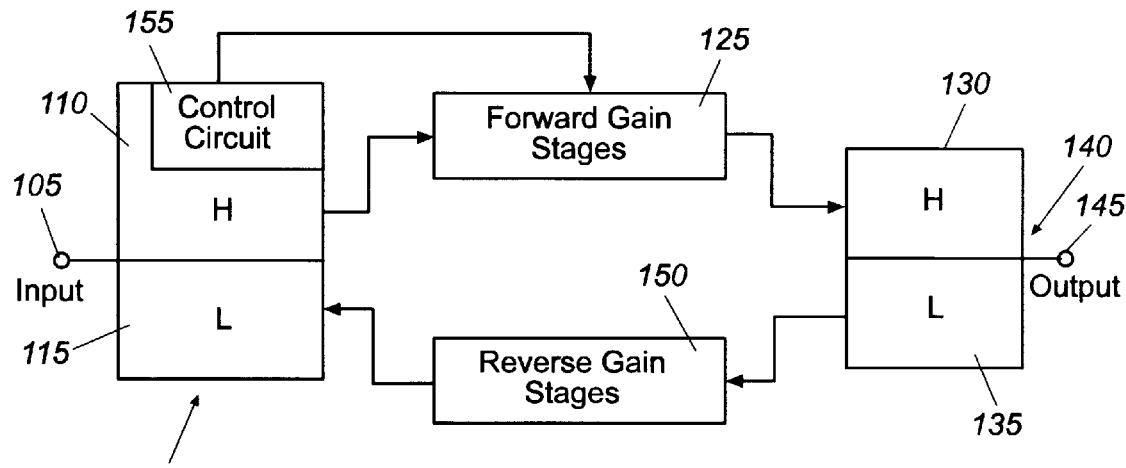
FIG. 3 is a block diagram of a distribution amplifier and plug-in module for use in a two-way broadband communications system which employs circuitry for minimizing the effects of insertion loss attributed to a diplex filter in accordance with the present invention.

In FIG. 3, there is shown a distribution amplifier 100 for use in a two-way broadband communications system. Such amplifier is described in greater detail in the above-noted commonly assigned application.

The distribution amplifier 100 includes an input port 105 for receiving downstream, or forward, radio frequency (RF) signals and for providing amplified upstream, or forward, RF signals to upstream portions of the broadband communications systems, such as nodes, hubs, and headend equipment. The amplifier 100 further includes a first diplex filter 120, which is preferably manufactured as a plug-in module that can be removably mounted in the amplifier 100 for easy replacement at a subsequent time. The diplex filter 120 allows the forward path signals and the reverse path signals to use the same coaxial cable without interference and is a three-port passive device having a high-pass filter 110 and a low pass filter 115 joined at a common point within the plug-in module.

The diplex filter 120 separates the forward path high frequency broadband signals (e.g., television channels) and the reverse path low frequency signals (e.g., data or monitoring channels). The output of the high pass filter 110 of diplex filter 120 is supplied to forward gain stages 125 for amplifying downstream RF signals. These amplified signals are then provided to the highpass filter 130 of another diplex filter 140, which may comprise a second plug-in module located at the output side of the forward gain stages 125, and then to an amplifier output port 145 that is coupled to other network distribution components, such as additional amplifiers, taps, and subscriber equipment.

The output port 145 receives reverse signals that can, for instance, be generated by subscriber equipment. The reverse signals are passed by the lowpass filter 135 of the diplex filter 140 to reverse gain stages 150 that amplifies the reverse signals. The amplified reverse signals are provided, via the lowpass filter 115 of the diplex filter 120, to the input port 105 of the amplifier 100 for continued transmission upstream within the broadband communication system, which could, for example, be a cable television system.

In accordance with the present invention, the amplifier 100 further includes a control circuit 155 located within diplex filter 120. The control circuit 155 compensates for the roll-off of the highpass portion 110 of the diplex filter 120 by providing a gain control signal to adjust the gain of the forward gain stages 125, thereby resulting in a flat amplifier response. This is done by selecting control circuit components to provide the correct compensation for the attenuation introduced by the diplex filter.

Figure 4:
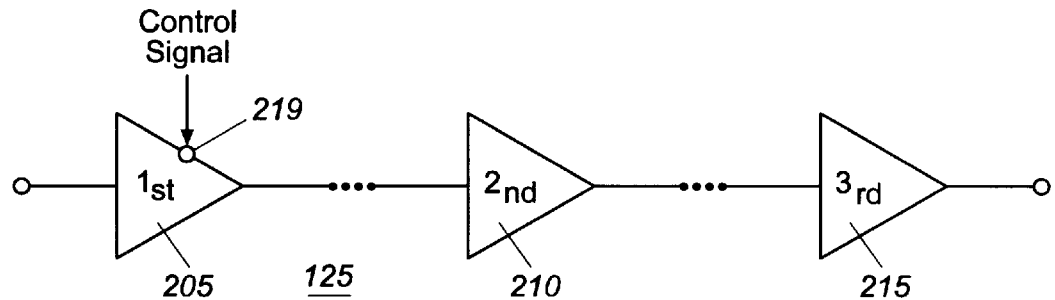
FIGS. 4 and 5 are block and schematic diagrams of circuitry for minimizing the effects of insertion loss attributed to a diplex filter in accordance with the present invention.

Referring next to FIG. 4, an electrical block diagram of the forward gain stages 125 is shown. The forward gain stages 125 of the amplifier 100 generally include one or more stages, where an amplifier circuit 205 corresponds to each stage. Although a single amplifier circuit 205, i.e., a single stage, could form the forward gain stages 125, it is more likely that several amplifier circuits 205, 210, 215, i.e., several gain stages, will be necessary. In such an event, the control signal could be provided by the control circuit 155 (FIG. 3) to any one of the amplifier circuits 205, 210, 215 or to more than one amplifier circuit. For illustration purposes, the control signal is shown as being coupled to amplifier circuit 205, via control terminal 219.

Figure 5:
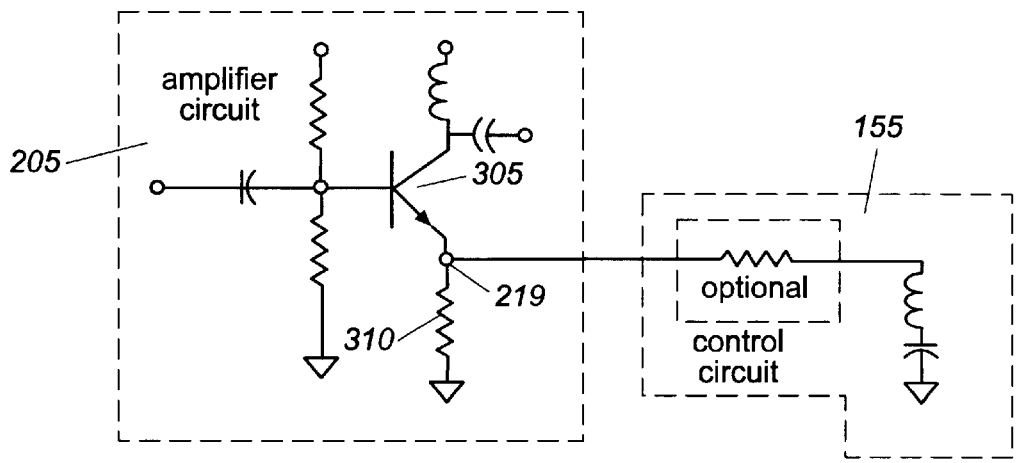

FIG. 5 is an electrical circuit diagram showing control of an amplifier circuit 205 by the control circuit 155 in more detail. The amplifier circuit 205 can include at least one biased transistor 305 and control terminal 219 coupled between the emitter of the transistor 305 and a resistor 310 coupled to the emitter and to ground. The control circuit 155, which is physically located within one of the diplex filter modules 120, 140, includes a series inductor and capacitor electrically coupled between the control terminal 219 and ground. A series resistor can be optionally included for controlling the Q of the amplifier circuit 205.

In accordance with the present invention, the values of the series inductor and capacitor of the control circuit 155 are chosen to result in a resonant frequency that is approximately that of the passband edge of the highpass filter 110 of the diplex filter 120 in which the control circuit 155 is located. In this manner, the control signal provided by the control circuit 155 causes the gain of the amplifier circuit 205 to increase at the edges of the amplifier passband, thereby flattening the amplifier output signal and decreasing the impact of diplex filter roll-off.

The control circuit 155, as mentioned, is preferably located within one of the diplex filter plug-in modules. Therefore, if the forward path cutoff frequency of the amplifier 100 is changed by replacing the diplex filter module, the resonant frequency of the control circuit 155 is automatically changed at the same time, without any additional action on the part of the technician. This feature advantageously prevents a technician from changing the diplex filter, thereby changing the frequency response of the highpass filter of the diplex filter, without changing out the control circuit 155, a situation which could result in roll-off compensation for an incorrect frequency range.

The control circuit 155 could, in accordance with the present invention, also include frequency selection circuitry for selecting the frequencies for which roll-off compensation is performed. The frequency selection circuitry could comprise, for instance, a tunable inductor and tunable capacitor, as opposed to or in addition to fixed-value inductor and capacitor circuitry. The tuning could be performed manually, by a technician, or in response to a selection control signal provided by a selection control circuit. Such selection control circuits are known in the art and could be included within the control circuit 155 or externally, either in some other portion of the amplifier 100 or within the broadband communication system.

Additional control circuits, similar to control circuit 155, can be coupled to control terminals of additional amplifier circuit to provide even greater compensation for diplex filter roll-off. This may be desirable, for instance, when the roll-off compensation provided by the control circuit 155 is not sufficient to flatten the frequency response of the forward path portion of the amplifier 100. In this case, control circuit may be included in the diplex filter 120 and connected to two or more amplifier circuits, thereby increasing the roll-off compensation by a factor of two or greater.

Figure 6:
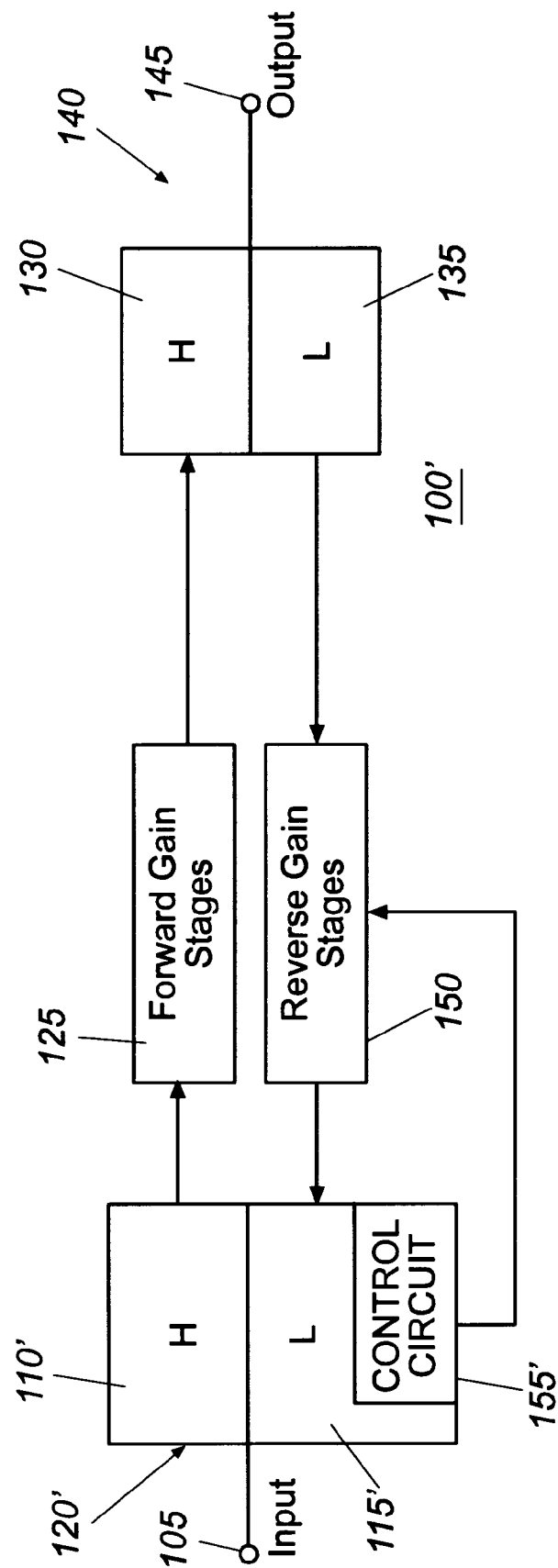
FIG. 6 is a block diagram of a distribution amplifier and alternative plug-in module for use in a broadband communications system.

Referring next to FIG. 6, an electrical block diagram shows another aspect of the present invention. As shown, the diplex filter 120' includes a highpass filter 110' and a lowpass filter 115'. According to this alternative embodiment, however, the lowpass filter 115' includes a control circuit 155' for controlling diplex filter roll-off in the reverse path of the amplifier 100. More specifically, a control circuit 155', similar in configuration and operation to control circuit 155', can be coupled to a control terminal of an amplifier circuit included in the reverse gain stages 150, which include amplifier circuits and other circuitry similar to that included in the forward gain stages 125.

The control circuit 155' included in the lowpass filter 115' can be used instead or in addition to a control circuit 155 (FIG. 3) for controlling diplex filter roll-off in the forward path of the amplifier 100'. In this manner, control circuits 155, 155' can compensate for attenuation introduced by both highpass and lowpass portions of different diplex filters within the amplifier 100'. It will be appreciated that the control circuit 155' actually compensates for attenuation introduced into the reverse path signals by the lowpass filter 135 of the diplex filter 140 that is located on the downstream side of the amplifier 100'. However, the control circuit 155' is shown as being included in the diplex filter 120' for purposes of convenience, since a single plug-in diplex filter module 120' could thereby include control circuits for both forward and reverse paths. One of ordinary skill in the art will understand that the control circuit 155' for the reverse path could be physically located within either diplex filter 120', 140 without impacting the advantages provided by the amplifier 100' of the present invention; likewise, the control circuit 155 for the forward path could be physically located within either diplex filter 120', 140.

Many variations and modification of the above described invention will become apparent to those of ordinary skill in the art from a reading of this disclosure. It should be realized that the invention is not limited to the particular apparatus disclosed, but its scope is intended to be governed only by the scope of the appended claims.

What is claimed is:

1. An amplifier for amplifying signals the amplifier comprising:
    a filter characterized by a cut-off frequency;
    an amplifier circuit for amplifying signals filtered by the filter, wherein the filter introduces attenuation in a frequency range; and
    a gain control circuit for controlling the gain of the amplifier circuit by adjusting the gain within the frequency range, wherein the gain control circuit includes:
        an inductor having first and second ends; and
        a capacitor having first and second ends, wherein the first end of the capacitor is coupled to the second end of the inductor, and wherein the second end of the capacitor is coupled to ground.

2. The amplifier of claim 1, wherein the gain control circuit increases the gain of the amplifier circuit within the frequency range.

3. The amplifier of claim 1, wherein the gain control circuit generates a gain control signal that is received by the amplifier circuit.

4. The amplifier of claim 1, wherein the gain control circuit includes frequency selection circuitry for selecting a frequency for which the gain of the amplifier circuit is to be adjusted.

5. The amplifier of claim 1, wherein the gain control circuit generates a gain control signal that is provided at the first end of the inductor.

6. The amplifier of claim 1, wherein the gain control circuit further comprises frequency selection circuitry for selecting a frequency for which the gain of the amplifier circuit is to be adjusted, and wherein the frequency selection circuitry includes a tunable capacitor and a tunable inductor.

7. The amplifier of claim 1, wherein the amplifier circuit comprises:
    a transistor; and
    a control terminal coupled to an emitter of the transistor and to the gain control circuit.

8. The amplifier of claim 1, wherein the filter comprises a diplex filter including a highpass filter and a lowpass filter, and the gain control circuit compensates for attenuation introduced by the highpass filter of the diplex filter.

9. The amplifier of claim 8, wherein the diplex filter is a plug-in module that can be inserted into and removed from the amplifier.

10. The amplifier of claim 9, wherein the gain control circuit is physically located within the plug-in module that houses the diplex filter.

11. An amplifier for amplifying signals, the amplifier comprising:
    a diplex filter having a highpass filter and a lowpass filter;
    an amplifier circuit for amplifying higher frequency signals provided by the highpass filter of the diplex filter, wherein the highpass filter introduces attenuation of the higher frequency signals within a particular frequency range; and
    a gain control circuit coupled to the amplifier circuit for adjusting the gain of the particular frequency range, wherein the gain control circuit includes:
        an inductor having first and second ends; and
        a capacitor having first and second ends, wherein the first end of the capacitor is coupled to the second end of the inductor, and wherein the second end of the capacitor is coupled to ground.

12. The amplifier of claim 11, wherein the gain control circuit increases the gain of the amplifier circuit within the particular frequency range.

13. The amplifier of claim 11, wherein the gain control circuit generates a gain control signal that is coupled to the amplifier circuit.

14. The amplifier of claim 11, wherein the gain control circuit includes frequency selection circuitry for selecting the particular frequency range for compensation by the gain control circuit.

15. The amplifier of claim 11, wherein the amplifier circuit comprises:
    a transistor; and
    a control terminal coupled to an emitter of the transistor and to the gain control circuit.

16. The amplifier of claim 15, wherein the diplex filter is a plug-in module that can be inserted into and removed from the amplifier.

17. The amplifier of claim 16, wherein the gain control circuit is physically located within the plug-in module that houses the diplex filter.

18. An amplifier for amplifying signals, the amplifier comprising:
    a diplex filter having a highpass filter and a lowpass filter, wherein the diplex filter is housed in a plug-in module that can be inserted into and removed from the amplifier;
    an amplifier circuit for amplifying higher frequency signals provided by the highpass filter of the diplex filter, wherein the highpass filter introduces attenuation of the higher frequency signals within a particular frequency range; and
    a gain control circuit coupled to the amplifier circuit for adjusting the gain of the particular frequency range, wherein the gain control circuit is housed in the plug-in module that houses the diplex filter.

* * * * *